(12) United States Patent
Loeppert et al.

(10) Patent No.: US 12,291,445 B2
(45) Date of Patent: May 6, 2025

(54) DUAL DIAPHRAGM DIELECTRIC SENSOR

(71) Applicant: Knowles Electronics, LLC, Itasca, IL (US)

(72) Inventors: Peter V. Loeppert, Durand, IL (US); Michael Pedersen, Long Grove, IL (US)

(73) Assignee: Knowles Electronics, LLC, Itasca, IL (US)

( * ) Notice: Subject to any disclaimer, the term of this patent is extended or adjusted under 35 U.S.C. 154(b) by 353 days.

(21) Appl. No.: 17/696,370

(22) Filed: Mar. 16, 2022

(65) Prior Publication Data

US 2023/0294977 A1 Sep. 21, 2023

(51) Int. Cl.
*B81B 3/00* (2006.01)

(52) U.S. Cl.
CPC .... *B81B 3/0086* (2013.01); *B81B 2201/0221* (2013.01); *B81B 2203/0127* (2013.01)

(58) Field of Classification Search
CPC .......... B81B 3/0086; B81B 2201/0221; B81B 2203/0127; B81B 7/02; B81B 7/0035; B81B 7/007; B81B 2201/02; H04R 19/02; H04R 19/04; H04R 2201/003; H04R 19/00
See application file for complete search history.

(56) References Cited

U.S. PATENT DOCUMENTS

| | | | | |
|---|---|---|---|---|
| 10,589,990 B2 * | 3/2020 | Dehe | ........................ | B81B 7/02 |
| 2022/0337947 A1 * | 10/2022 | Loeppert | ................ | H04R 19/04 |
| 2023/0134752 A1 * | 5/2023 | Kuntzman | ............ | B81B 3/0021 |
| | | | | 381/355 |

* cited by examiner

*Primary Examiner* — Khaja Ahmad
*Assistant Examiner* — Sun Mi Kim King
(74) *Attorney, Agent, or Firm* — Flener IP & Business Law; Zareefa B. Flener

(57) ABSTRACT

A microelectromechanical systems (MEMS) device comprises a MEMS die that comprises first and second diaphragms, a first plurality of electrodes each disposed on the first diaphragm, and a second plurality of electrodes each disposed on the second diaphragm. A fixed dielectric element is disposed between the first and second diaphragms and includes a plurality of apertures. The MEMS die further comprises a third plurality of electrodes, wherein each of the third plurality comprises a first conductive layer disposed on the first diaphragm proximate to at least one of the first plurality and a second conductive layer disposed on the second diaphragm proximate to at least one of the second plurality, and a conductive pin that extends through an aperture of the plurality of apertures and electrically connects the first conductive layer to the second conductive layer.

20 Claims, 5 Drawing Sheets

DUAL DIAPHRAGM DIELECTRIC SENSOR

FIELD OF THE DISCLOSURE

The present disclosure relates generally to a microelectromechanical systems (MEMS) die, and more particularly to a MEMS die having a dual diaphragm dielectric sensor.

BACKGROUND

It is known that in the fabrication of MEMS devices often a plurality of devices are manufactured in a single batch process in the form of a wafer(s). Individual portions of the batch processed wafer(s) representative of individual MEMS devices are known as dies. Accordingly, a number of MEMS dies can be manufactured in a single batch processed wafer and then cut apart or otherwise separated for further fabrication steps or for their ultimate use, which for example without limitation includes use as an acoustic transducer or other portion of a microphone.

In existing MEMS capacitive sensors two conductive electrodes are defined including a movable element identified as a diaphragm and a fixed element identified as a backplate. Motion of the movable element relative to the backplate in response to sound input creates a modulated capacitance.

DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

Figure 1:
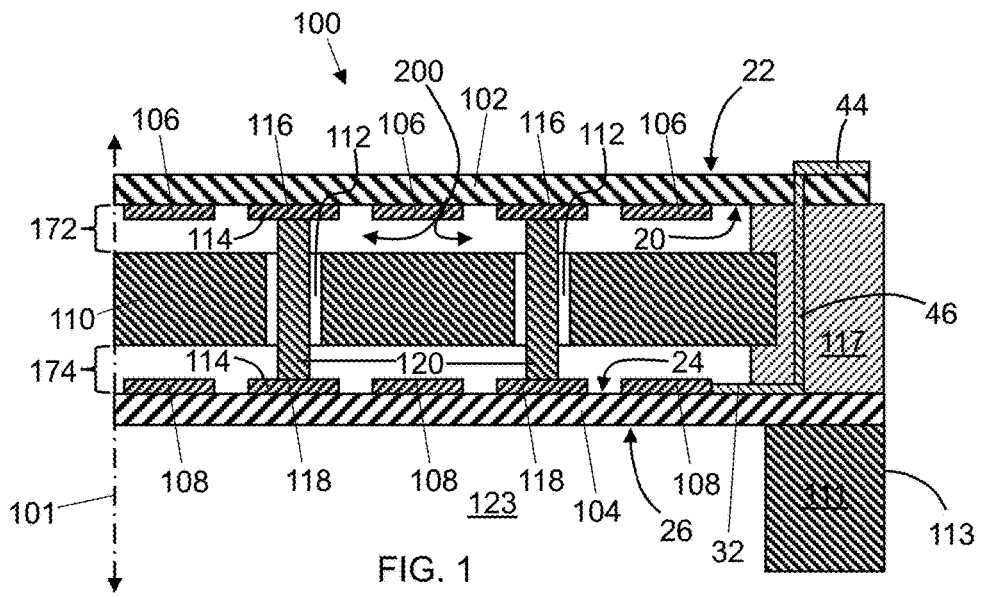
FIG. 1 is a cross-sectional schematic view of the MEMS die of FIG. 2 taken generally along the lines 1-1 of FIG. 2.

In the following detailed description, various embodiments are described with reference to the appended drawings. The skilled person will understand that the accompanying drawings are schematic and simplified for clarity. Like reference numerals refer to like elements or components throughout. Like elements or components will therefore not necessarily be described in detail with respect to each figure.

DETAILED DESCRIPTION

According to various embodiments described herein, a MEMS die comprises first and second diaphragms, a first plurality of electrodes, each of the first plurality disposed on the first diaphragm, and a second plurality of electrodes, each of the second plurality disposed on the second diaphragm. A fixed dielectric element is disposed between the first and second diaphragms and includes a plurality of apertures. The MEMS die further comprises a third plurality of electrodes, wherein each of the third plurality comprises a first conductive layer disposed on the first diaphragm proximate to at least one of the first plurality and a second conductive layer disposed on the second diaphragm proximate to at least one of the second plurality, and a conductive pin that extends through an aperture of the plurality of apertures and electrically connects the first conductive layer to the second conductive layer. The MEMS die generates one or more signals based on a change in capacitance resulting from movement of the first and second diaphragms relative to the fixed dielectric element. According to an embodiment, the fixed dielectric element is free of conductive layers.

In an embodiment at least subsets of the first plurality of electrodes are electrically connected to each other, at least subsets of the second plurality of electrodes are electrically connected to each other, and at least subsets of the third plurality of electrodes are electrically connected to each other. In an embodiment the first diaphragm has a first side and a second side opposite the first side, the second diaphragm has a first side and a second side opposite the first side, wherein the first side of the first diaphragm faces the first side of the second diaphragm, wherein the MEMS die further comprises a first connector pad disposed on the second side of the first diaphragm in electrical connection with at least a first subset of the first plurality of electrodes, a second connector pad disposed on the second side of the first diaphragm in electrical connection with at least a first subset of the second plurality of electrodes, and a third connector pad disposed on the second side of the first diaphragm in electrical connection with at least a first subset of the third plurality of electrodes. According to an embodiment, a MEMS device further comprises a voltage source electrically connected to at least a first subset of the third plurality of electrodes to provide a voltage bias to the first subset of the third plurality of electrodes relative to ground, a differential amplifier, a first electrical connection between at least a first subset of the first plurality of electrodes and a first input to the differential amplifier, and a second electrical connection between at least a first subset of the second plurality of electrodes and a second input to the differential amplifier.

According to an embodiment, a low pressure region is defined between the first diaphragm and the second diaphragm. In an embodiment, the low pressure region is bounded by the first sides of the first and second diaphragms. In an embodiment, the MEMS die further comprises a sealed tunnel that extends through the first and second diaphragms, wherein the tunnel provides fluid communication between the second sides of the first and second diaphragms, and wherein the tunnel is configured to maintain the low pressure region.

In an embodiment, the MEMS device further comprises an integrated circuit (IC) and a housing comprising a base having a first surface and an opposing second surface, a cover attached to the first surface of the base, wherein the cover and the base define an interior of the housing, and a port that permits pressure waves to enter the interior, wherein the MEMS die is disposed within the interior of the housing, and wherein the IC is disposed within the interior of the housing and electrically connected to the MEMS die.

In an embodiment, the port extends through the base and the MEMS die is disposed over the port. In an embodiment, each of the first and second pluralities of electrodes and each of the first and second conductive layers of the third plurality of electrodes comprises strips having a length to width ratio of at least about 5 to 1. In an embodiment, the strips are substantially parallel, wherein the strips of the first and third plurality of electrodes are arranged alternately side by side on the first diaphragm and the strips of the second and third plurality of electrodes are arranged alternately side by side on the second diaphragm.

In the current disclosure, two or more electrodes are fixed relative to each other to define a capacitor having a capacitance, but move together relative to a fixed dielectric element that is not an electrode and does not have a conductive portion. Thus, motion of the two or more electrodes relative to the fixed dielectric element caused by input including, sound pressure, vibration, or acceleration, causes a change of the effective dielectric constant of the capacitor, and thus the value of capacitance between the two or more electrodes, which is indicative of the input.

Figure 2:
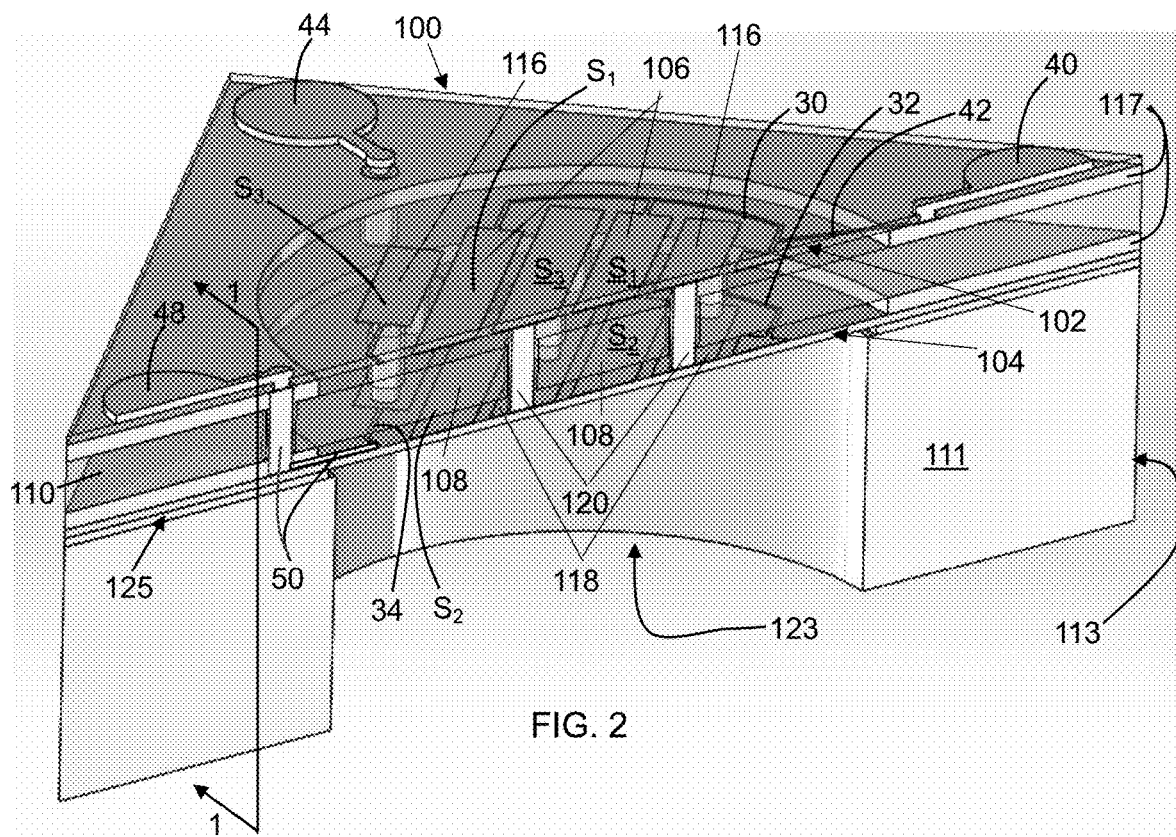
FIG. 2 is a top cross-sectional perspective schematic view of a MEMS die according to an embodiment, and including a partially transparent portion for better illustration of internal components.

Turning to FIGS. 1 and 2, a MEMS die 100 according to an embodiment is shown schematically. An exemplary MEMS die 100 is shown in a top cross-sectional perspective view in FIG. 2, wherein a portion of a first diaphragm 102 and a fixed dielectric element 110 are both illustrated as transparent to better show internal structures as further described below. FIG. 1 illustrates an exemplary MEMS die 100 in a cross-sectional view taken generally along the lines 1-1 of FIG. 2.

In an embodiment the MEMS die 100 includes a substrate 111 having an outer boundary 113 as indicated in FIG. 1. In an embodiment the substrate 111 has a generally rectangular perimeter, but in other embodiments it can be any shape. The substrate 111 in an embodiment includes an opening 123 formed therethrough.

Referring to FIG. 1, in an embodiment the MEMS die 100 includes a first diaphragm 102 and a second diaphragm 104. A half or one lateral side of the MEMS die 100 is shown in FIG. 1, with a centerline for the MEMS die identified on the left side by the centerline 101. A fixed dielectric element 110 is disposed between the first and second diaphragms 102, 104 and includes a plurality of apertures 112 disposed therethrough. The fixed dielectric element 110 is relatively thick and/or stiff compared to the first and second diaphragms 102 and 104, for example by being fabricated using thicker materials or using thin very high tensile stress films to maintain sufficient rigidity. The fixed dielectric element 110 remains relatively motionless when the first and second diaphragms 102 and 104 are deflected.

In an embodiment the second diaphragm 104 is attached to the substrate 111 over the opening 123 via a spacer layer 125, as visible in FIG. 2. However, in an embodiment of the MEMS die 100 (see FIG. 1) at least a portion of the second diaphragm 104 is attached directly to the substrate 111. In some embodiments the spacer layer 125 can be an integral part of the substrate 111 or added onto the substrate 111 as an additional sacrificial layer 125. The spacer layer 125 can, for example, be made of any insulative material as described hereinbelow. In an embodiment the substrate 111 is made of silicon.

Figure 7:
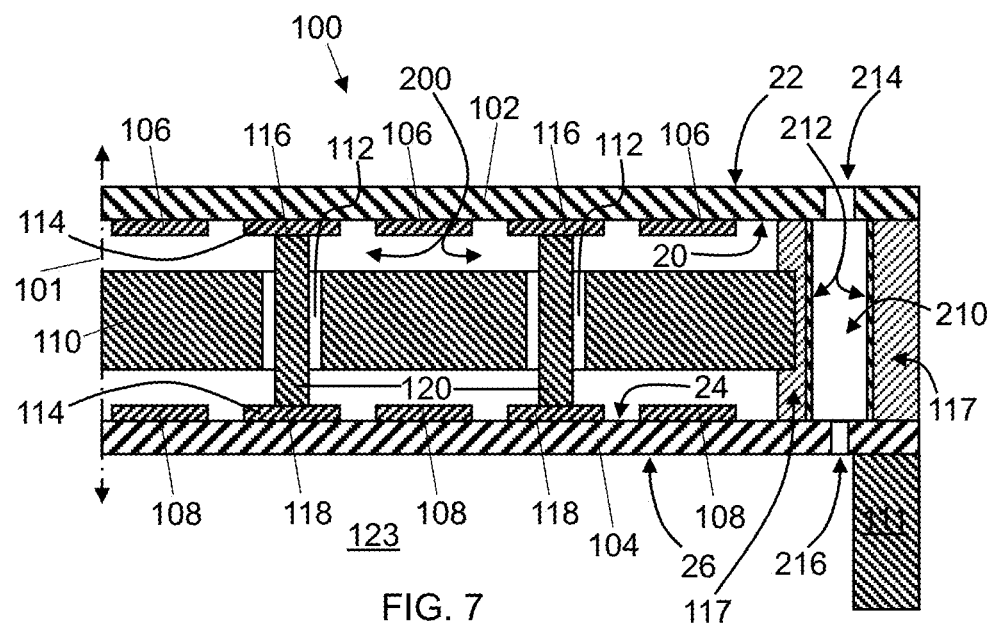
FIG. 7 is a cross-sectional schematic view of a MEMS die, according to another embodiment.
Figure 8:
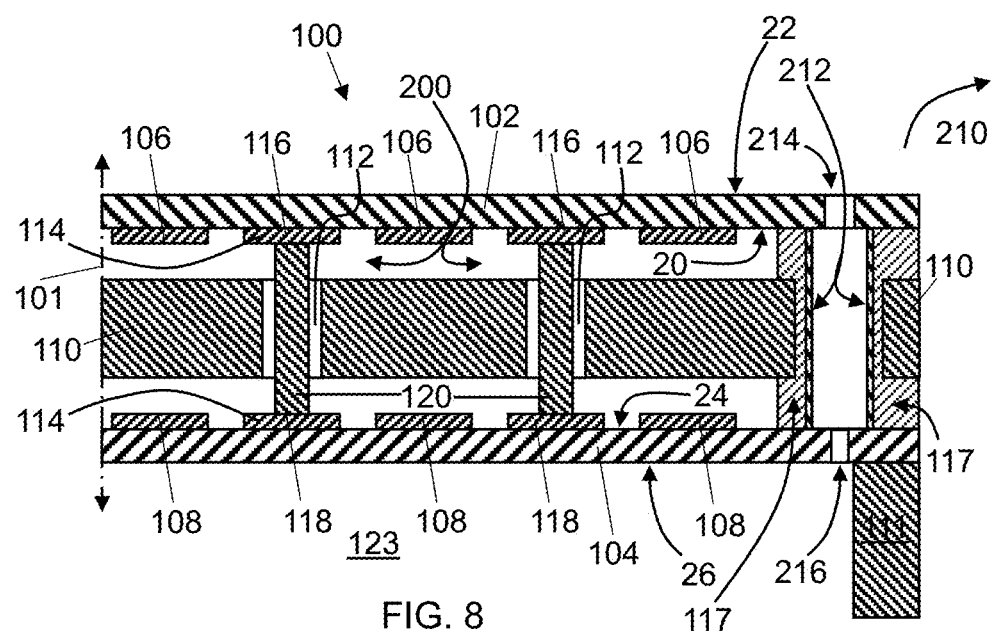
FIG. 8 is a cross-sectional schematic view of a MEMS die, according to a further embodiment.

In an embodiment each of the first and second diaphragms 102, 104 extends radially to the outer boundary 113 of the substrate 111, as illustrated in FIG. 2. In other embodiments the first and second diaphragms 102, 104 extend over the opening 123 but one or both of the first and second diaphragms 102, 104 does not extend radially to the outer boundary 113, as illustrated in FIG. 1. In an embodiment the fixed dielectric element 110 extends radially to the outer boundary 113 of the substrate 111, as illustrated in FIGS. 2 and 8. In other embodiments the fixed dielectric element 110 extends over the opening 123 but does not extend radially to the outer boundary 113, as illustrated in FIGS. 1 and 7. A radially outer portion of each of the first and second diaphragms 102, 104 is rigidly attached to a radially outer portion of the fixed dielectric element 110. In an embodiment, a material 117 (see FIGS. 1 and 2) is disposed between the fixed dielectric element 110 and each of the first and second diaphragms 102 and 104. The material 117 can be a sacrificial material that can, for example, be made of any insulative material as described hereinbelow.

Referring to FIGS. 1 and 2, a first plurality of electrodes 106 is disposed on the first diaphragm 102, and a second plurality of electrodes 108 is disposed on the second diaphragm 104. A third plurality of electrodes 114 each comprises a first conductive layer 116 disposed on the first diaphragm 102 proximate to at least one of the first plurality of electrodes 106 and a second conductive layer 118 disposed on the second diaphragm 104 proximate to at least one of the second plurality of electrodes 108. In an embodiment, the proximate arrangement of any pair of electrodes as described above means that the pair of electrodes is separated by a finite gap or spacing. In an embodiment, the gap or spacing is narrower than a width of the narrower electrode of the pair. In an embodiment, the gap or spacing is narrower than half the width of the narrower electrode of the pair, and in another embodiment the gap or spacing is narrower than a quarter of the width of the narrower electrode of the pair.

Conductive pins 120 extend through the apertures 112 and electrically connect the first and second conductive layers 116, 118. The conductive pins also provide structural integrity to prevent the first and second diaphragms 102, 104 from collapsing onto the fixed dielectric element 110 due to the ambient pressure load.

Referring now to FIG. 1, the first diaphragm 102 has a first side 20 and a second side 22 opposite the first side 20. Similarly, the second diaphragm 104 has a first side 24 and a second side 26 opposite the first side 24. In this embodiment the first side 20 of the first diaphragm 102 faces the first side 24 of the second diaphragm 104.

The geometric arrangement of the first, second, and third pluralities of electrodes 106, 108, 114 varies in different embodiments, and for example without limitation, can be curvilinear arcs or strips of conductive material arranged in spirals or in a partially concentric pattern, wherein members of the first plurality of electrodes 106 are arranged proximate to members of the third plurality of electrodes 114 on the first diaphragm 102, and wherein members of the second plurality of electrodes 108 are arranged proximate to members of the third plurality of electrodes 114 on the second diaphragm 104. In an embodiment, the first, second, and third pluralities of electrodes 106, 108, 114 comprise straight strips of conductive material distributed or arranged in a side by side arrangement.

For example, referring to the exemplary MEMS die 100 shown in FIG. 2, in an embodiment each of the first and second pluralities of electrodes 106,108 and each of the first and second conductive layers 116, 118 of the third plurality of electrodes 114 comprises a strip of conductive material, $S_1$, $S_2$, $S_3$, respectively, wherein each of the strips $S_1$, $S_2$, $S_3$ has a length to width ratio of at least 5 to 1. In an embodiment, each of the strips $S_1$, $S_2$, $S_3$ is separated into segments that are arranged side by side or end to end and electrically connected, for example, by a conductive trace, wherein each of the segments has a length to width ratio as needed or required by the overall geometry.

Still referring to FIG. 2, in this embodiment the strips $S_1$, $S_2$, $S_3$ are substantially parallel. The strips $S_1$ of the first plurality of electrodes 106 are arranged alternately side by side with the strips $S_3$ of the third plurality of electrodes 114 on the first side 20 of the first diaphragm 102. Similarly, the strips $S_2$ of the second plurality of electrodes 108 are arranged alternately side by side with the strips $S_3$ of the third plurality of electrodes 114 on the first side 24 of the second diaphragm 104.

Figure 3:
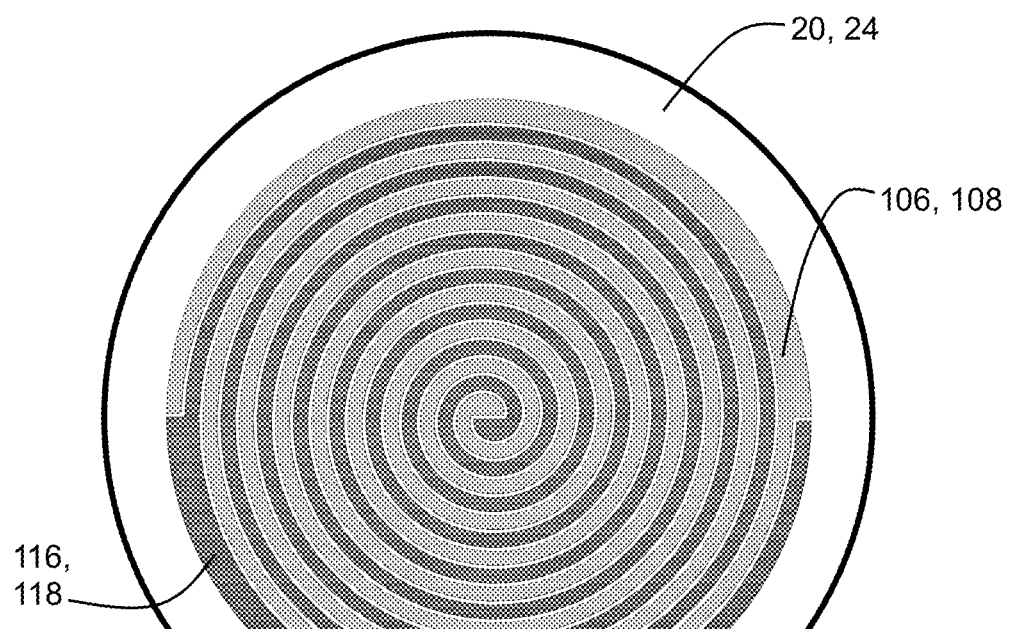
FIG. 3 is a top plan view of an exemplary geometric arrangement of electrodes on a diaphragm of a MEMS die according to an embodiment.

The geometrical arrangement of the first, second, and third pluralities of electrodes 106, 108, 114 is different than that shown in FIG. 2 in other embodiments. For example, in an embodiment each of the pluralities of first and second electrodes 106, 108 is a curvilinear shaped electrode arranged on a respective first side 20, 24 in a spiral pattern proximate to curvilinear shaped first and second pluralities of conductive layers 116, 118. An example of a spiral configuration of the first plurality of electrodes 106 (or the second plurality of electrodes 108) and the first plurality of conductive layers 116 (or the second plurality of conductive layers 118) arranged on the first side 20 of the first diaphragm 102 (or on the first side 24 of the second diaphragm 104) is shown in FIG. 3.

Figure 4:
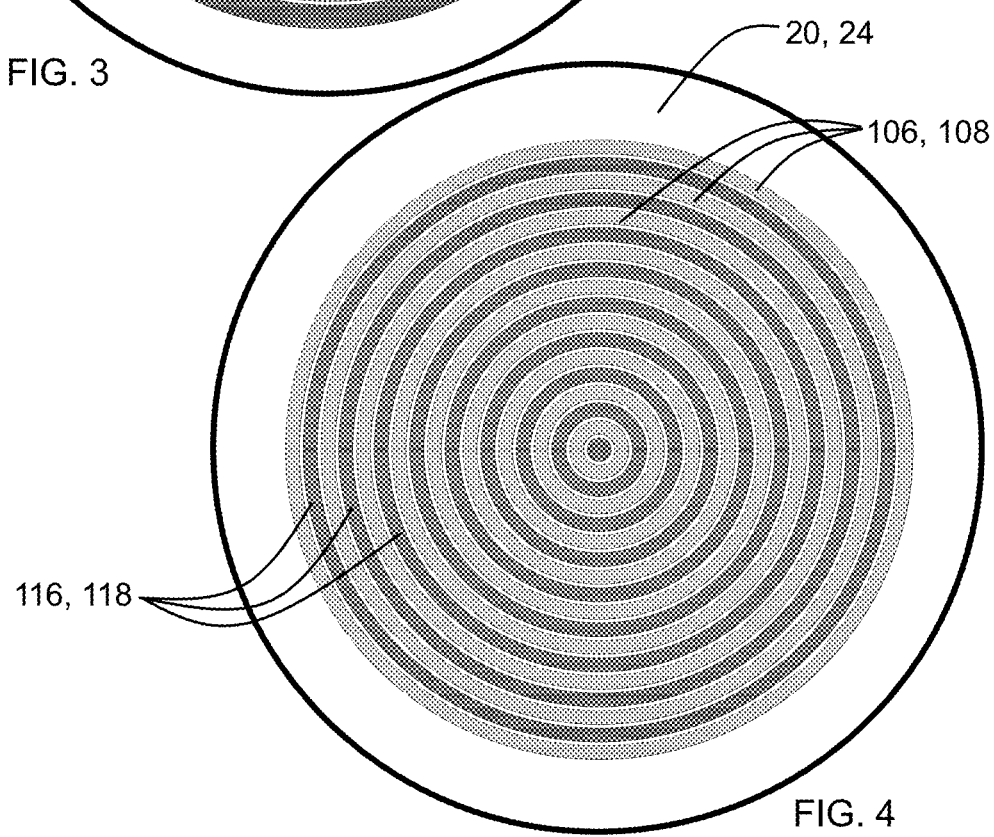
FIG. 4 is a top plan view of an exemplary geometric arrangement of electrodes on a diaphragm of a MEMS die according to another embodiment.

In another embodiment, each of the pluralities of first and second electrodes 106, 108 is a curvilinear shaped electrode arranged in a generally concentric pattern proximate to curvilinear shaped first and second pluralities of conductive layers 116, 118. An example of a generally concentric configuration of the first plurality of electrodes 106 (or the second plurality of electrodes 108) and the first plurality of conductive layers 116 (or the second plurality of conductive layers 118) arranged on the first side 20 of the first diaphragm 102 (or on the first side 24 of the second diaphragm 104) is shown in FIG. 4. In other embodiments, each of the first and second pluralities of electrodes 106, 108 is an electrode having a shape comprising linear and/or curvilinear elements arranged on a respective first side 20, 24 in any pattern proximate to linear and/or curvilinear shaped first and second pluralities of conductive layers 116, 118.

Referring again to FIG. 2, in an embodiment at least subsets of the first plurality of electrodes 106 are electrically connected to each other, for example by one or more wires or conductive traces 30. Similarly, in an embodiment at least subsets of the second plurality of electrodes 108 are electrically connected to each other, for example by one or more wires or conductive traces 32. Further, in an embodiment at least subsets of the third plurality of electrodes are electrically connected to each other, for example by one or more wires or conductive traces 34.

In an embodiment each of the one or more conductive traces 30, 32, 34 is electrically connected to a connector pad disposed on the second side 22 of the first diaphragm 102. For example, as illustrated in FIG. 2, first, second, and third connector pads 40, 44, 48 are disposed on the second side 22 of the first diaphragm 102. The first connector pad 40 is electrically connected with a first pad trace 42 that is electrically connected with the one or more conductive traces 30. As shown schematically in FIG. 1, the second connector pad 44 (shown on the right side in FIG. 1 for convenience of explanation) is electrically connected with a second pad trace 46 that is electrically connected with the one or more conductive traces 32. As shown in FIG. 2, the third connector pad 48 is electrically connected with a third pad trace 50 that is electrically connected with the one or more conductive traces 34.

Figure 5:
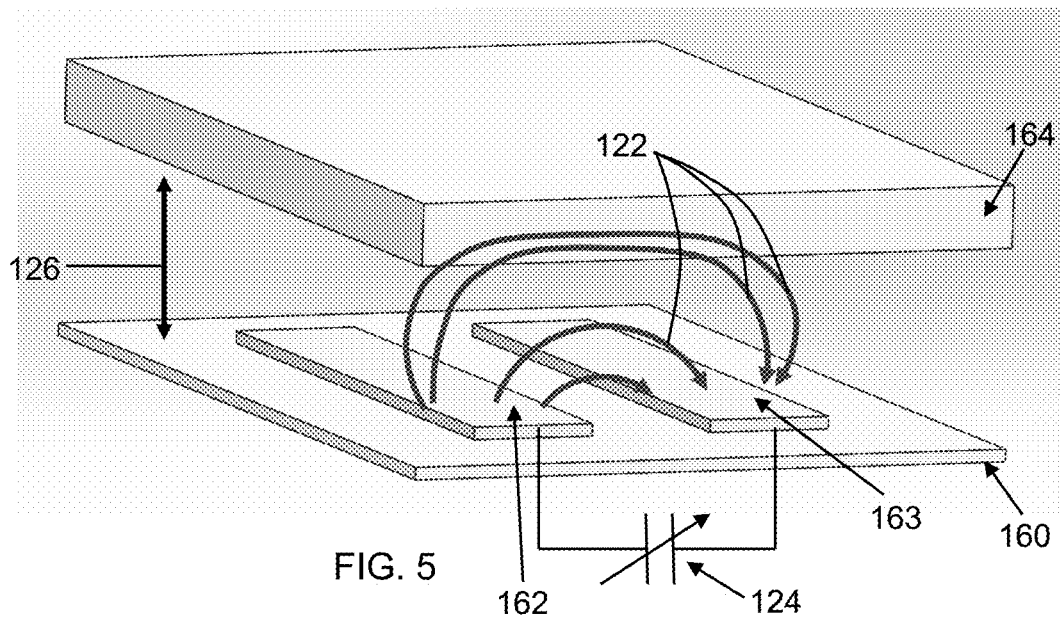
FIG. 5 is a simplified perspective view of portions of a MEMS die, according to an embodiment.

Referring to FIG. 5, a simplified exemplary structure of some generic components is shown schematically in perspective with exemplary electric field lines 122 added. In the illustration of FIG. 5, for clarity only a single generic diaphragm 160 is shown, and a generic pair of electrodes 162 and 163 is shown on a surface of the single diaphragm 160 facing a generic fixed dielectric element 164. Electrode 162 is a generic common electrode, described hereinabove as one of the third plurality 114 of electrodes having first and second conductive layers 116, 118. So the electrode 162 is structurally equivalent to either of the first and second conductive layers 116, 118 illustrated in FIGS. 1-4. Similarly, electrode 163 is a generic electrode described hereinabove as one of either the first or second pluralities 106, 108 of electrodes, and is structurally equivalent to one of either the first or second pluralities 106, 108 of electrodes illustrated in FIGS. 1-4.

The generic common electrode 162 is electrically biased by a DC voltage relative to electrode 163. In this configuration, the generic pair of electrodes 162 and 163 defines a capacitor having a capacitance as shown by the symbology 124, wherein the capacitor has an effective dielectric constant that is dependent on the relative geometry of the illustrated components including a spacing 126 between the single generic diaphragm 160 and the generic fixed dielectric element 164. Changes of the spacing 126 in conjunction with the dielectric constant of the fixed dielectric element 164 causes a compression or expansion of the electric field lines 122 and a corresponding change in the effective dielectric constant, which causes a change in the capacitance 124.

Referring now to FIG. 1, the structure as described in regard to FIG. 5 is present on both sides of the fixed dielectric element 110. In this embodiment, each pair of adjacent electrodes, defined by a first electrode 106 adjacent to a first conductive layer 116, disposed on the first side 20 of the first diaphragm 102, defines a capacitor having an effective dielectric constant that is dependent on geometry including a spacing 172 between the first diaphragm 102 and the fixed dielectric element 110. Similarly, each pair of adjacent electrodes, defined by a second electrode 108 adjacent to a second conductive layer 118, disposed on the first side 24 of the second diaphragm 104, defines a capacitor having an effective dielectric constant that is dependent on geometry including a spacing 174 between the second diaphragm 104 and the fixed dielectric element 110.

Each of the first and second diaphragms 102, 104 can move in response to input including, for example without limitation, sound pressure, vibration, or acceleration. The first and second diaphragms 102, 104 both move relative to the fixed dielectric element 110 to change the spacing 172, 174, respectively, therebetween. As described in regard to FIG. 5, changes of the spacings 172, 174 causes a change in the effective dielectric constant for the capacitor defined by at least subsets of each of the first and second pluralities of electrodes 106, 108. The changes in the dielectric constants cause a change in the capacitances as measured across at least subsets of each of the first and second pluralities of electrodes 106, 108.

The symmetry of the MEMS die of FIGS. 1 and 2 leads to the capacitance value defined by at least subsets of the first and third pluralities of electrodes 106, 114 to change in an opposite direction from the change in the capacitance value defined by at least subsets of each of the second and third pluralities of electrodes 108, 114 due to changes in the spacings 172 and 174 in response to the input.

Figure 6:
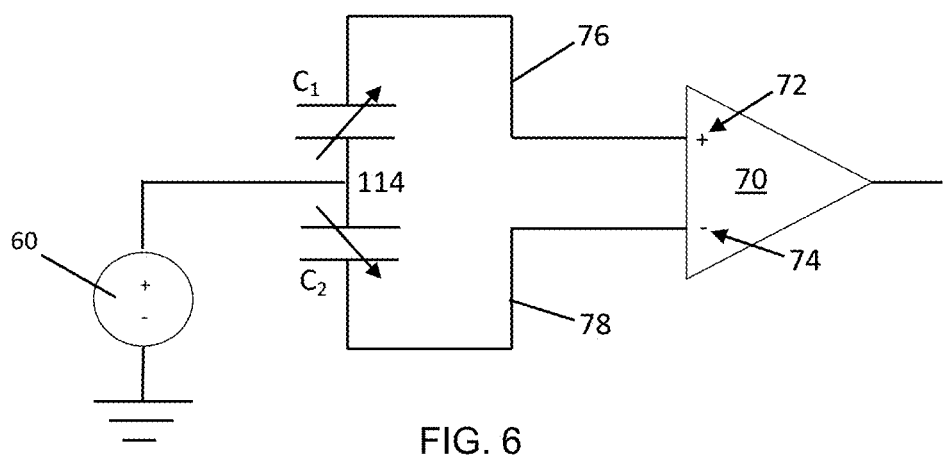
FIG. 6 is an exemplary electrical schematic of a circuit defined by a MEMS die, according to an embodiment.

Referring now to FIGS. 2 and 6, in an embodiment a voltage source 60 is electrically connected to at least a subset of the third plurality of electrodes 114. For example, the voltage source 60 is connected via the third connector pad 48 to at least a subset of the third plurality of electrodes 114. The voltage source provides a voltage bias to at least the subset of the third plurality of electrodes 114 relative to ground.

In the electrical schematic of FIG. 6, corresponding to an exemplary embodiment of the MEMS die 100, a differential amplifier 70 includes first and second inputs 72,74. A first electrical connection 76 connects at least a subset of the first plurality of electrodes 106 to the first input 72 to the differential amplifier 70, for example via a physical connection between the first connector pad 40 and the first input 72 to the differential amplifier 70. The reference character $C_1$ is representative of the capacitance of at least a subset of the first plurality of electrodes 106 and first conductive layer 116 disposed on the first diaphragm 102.

A second electrical connection 78 connects at least a subset of the second plurality of electrodes 108 to the second input 74 to the differential amplifier 70, for example via a physical connection between the second connector pad 44 and the second input 74 to the differential amplifier 70. The reference character $C_2$ is representative of the capacitance of at least a subset of the second plurality of electrodes 108 and second conductive layer 118 disposed on the second diaphragm 104. Therefore, the MEMS die 100 generates one or more signals based on a change in capacitance resulting from movement of the first and second diaphragms 102, 104 relative to the fixed dielectric element 110, and the one or more signals are electrically connected to first and second inputs 72, 74 of the differential amplifier 70.

In an embodiment, each of the first and second inputs 72,74 of the differential amplifier 70 has an input impedance greater than about 1 giga-ohm. The input impedances of the first and second inputs 72,74 establishes a DC bias level at each input of less than the power supply DC bias level relative to ground potential and preferably less than half of the power supply DC bias level relative to ground potential.

Referring to FIG. 7, a vacuum region, near or partial vacuum region, or low pressure region 200 (hereinafter "low pressure region") is defined between the first diaphragm 102 and the second diaphragm 104. The low pressure region 200 in some embodiments has a pressure below atmospheric pressure. In an embodiment the low pressure region 200 has an internal pressure, for example, of less than 100,000 Pa. In another embodiment the low pressure region 200 has an internal pressure of less than 10,000 Pa. In a further embodiment the low pressure region 200 has an internal pressure of less than 1,000 Pa, and in yet another embodiment the low pressure region 200 has an internal pressure of less than 100 Pa.

In an embodiment the low pressure region 200 is bounded by the first sides 20, 24 of the first and second diaphragms 102, 104, respectively. In an embodiment, a sealed tunnel 210 extends through the first and second diaphragms 102, 104 without extending through the fixed dielectric element 110, for example, as illustrated in FIG. 7. In other embodiments, the sealed tunnel 210 also extends through the fixed dielectric element 110, as illustrated in FIG. 8. FIG. 7 illustrates the sealed tunnel 210 proximate to an outer edge of the MEMS die 100; however, in other embodiments the sealed tunnel 210 is disposed along the centerline 101 or at any location along the radius of the MEMS die 100 as is desired or advantageous for that embodiment. In an embodiment the opening 123 of the substrate 111 at least partially overlaps vertically with the sealed tunnel 210.

In an embodiment the sealed tunnel 210 is sealed by a bounding wall 212 shown in cross-section in FIGS. 7 and 8. In an embodiment, the geometry of the bounding wall 212 can be selected so that the cross-sectional shape of the sealed tunnel 210 as seen in plan view from above can be any regular or irregular shape as is desired or advantageous to the embodiment. In an embodiment at least a portion of the bounding wall 212 is surrounded by the material 117. The material 117 can be a sacrificial material, and the material 117 and the bounding wall 212 can, for example, be made of any insulative material as described hereinbelow. In an embodiment the bounding wall 212 can be made from the same material as the conductive pins 120, as described hereinbelow.

A first pierce 214 is disposed through the first diaphragm 102 and a second pierce 216 is disposed through the second diaphragm 104. The sealed tunnel 210 therefore provides fluid communication between and the second sides 22, 26 of the first and second diaphragms 102, 104, respectively, while maintaining the low pressure region 200 between the first and second diaphragms 102, 104.

In an embodiment the fixed dielectric element 110 is free of conductive layers. In an embodiment the fixed dielectric element 110 and the first and second diaphragms 102,104 are each made from any insulative material that would not be damaged during a sacrificial layer removal process. For example, without limitation, the insulative material can be silicon nitride, silicon oxynitride, metal oxides, polymers, materials that are not damaged by a sacrificial layer removal process, and combinations thereof. Similarly, the material of any of the first, second, and third electrodes 106,108,114, the conductive pins 120, the bounding wall 212, and the connector pads 40,44,48 can be any conductive material that would not be damaged during a sacrificial layer removal process. For example, without limitation, the conductive material can be polycrystalline silicon, one or more metals, alloys of metals, carbon, materials that are not damaged by a sacrificial layer removal process, and combinations thereof.

Referring to FIGS. 1, 2, and 7, the fixed dielectric element 110 is disposed between the first diaphragm 102 and the second diaphragm 104. In an embodiment the first and second diaphragms 102, 104 extend over the entire substrate 111. In other embodiments the first and second diaphragms 102, 104 extend over a portion but not all of the substrate 111. A mechanically active area for each of the first and second diaphragms 102, 104 is defined by the innermost radial boundary (the release front) of the material 117 disposed between the fixed dielectric element 110 and each of the first and second diaphragms 102, 104. As shown in FIGS. 1 and 2, in an embodiment portions of the first and second diaphragms 102, 104 extend radially beyond the release fronts.

During operation of the MEMS die 100 described hereinabove, for example as an acoustic transducer 1000 that is part of a device, for example a sensor assembly 900 (see FIG. 9), electric charge in the form of a DC voltage bias relative to ground is applied to at least a subset of the third plurality of electrodes 114, wherein the third plurality of electrodes 114 comprises first and second pluralities of conductive layers 116, 118 that are disposed, respectively, on the first and second diaphragms 102, 104 and connected by conductive pins 120. The inputs 72, 74 of amplifier 70 provide a DC bias near ground potential to at least subsets of the first and second electrodes 106, 108. An electric field is induced between every pair of electrodes disposed on the first side 20 of the first diaphragm 102 and the first side 24 of the second diaphragm 104.

Therefore, as described hereinabove in reference to FIGS. 1 and 5, at least pairs of the first electrodes 106 and first conductive layer 116 disposed on the first diaphragm 102 define a first capacitor having a first capacitance, and at least pairs of the second electrodes 108 and second conductive layer 118 disposed on the second diaphragm 104 define a second capacitor having a second capacitance. Motion of the first and second diaphragms 102, 104 relative to the fixed dielectric element 110 caused by input including, for example without limitation, sound pressure, vibration, or acceleration, causes a change in spacing 172, 174 between each of the first and second diaphragms 102, 104 and the fixed dielectric element 110, respectively. The change in spacings cause changes of the effective dielectric constant of each of the first and second capacitors, thereby modulating the first and second capacitances, which can be detected as changes in output voltage levels that can be amplified as described in regard to FIG. 6.

Figure 9:
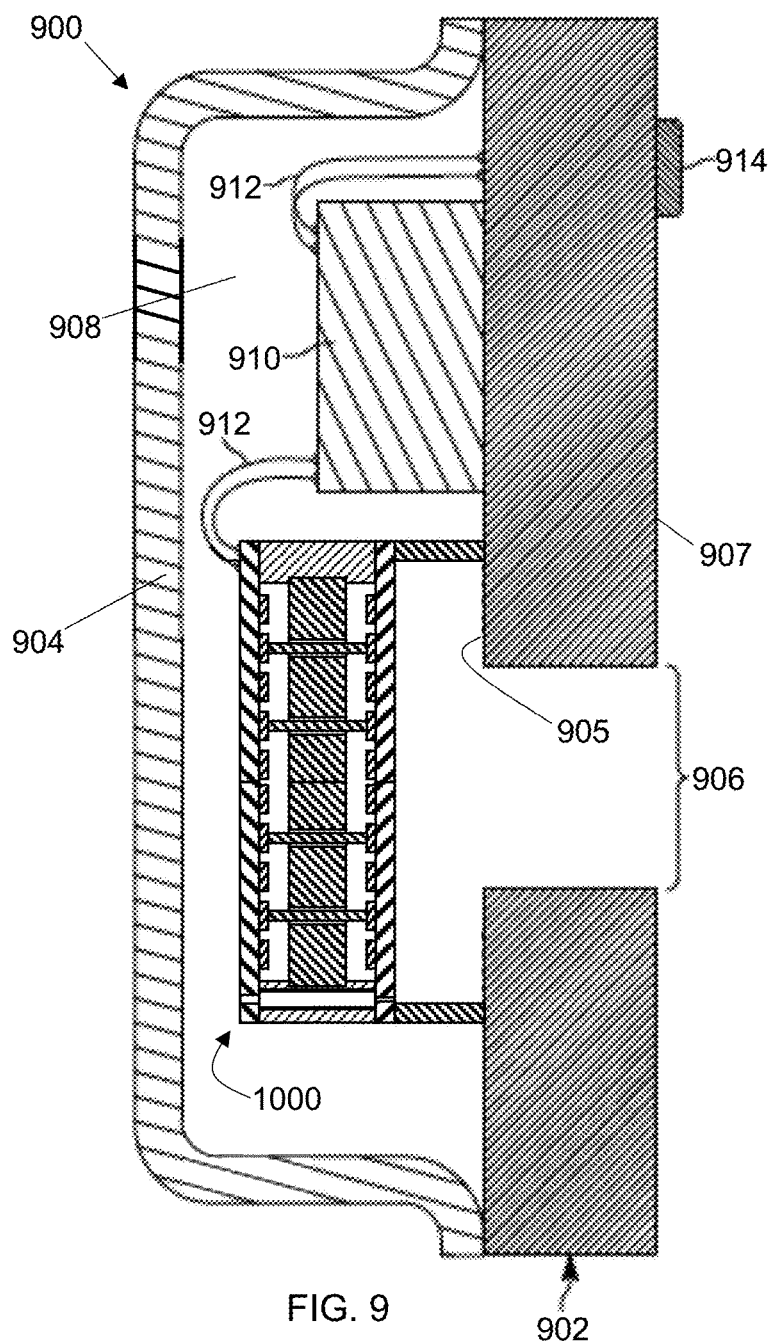
FIG. 9 is a cross-sectional view of a sensor assembly according to an embodiment.

Turning to FIG. 9, the MEMS die 100 used as an acoustic transducer 1000 is configured to fit within a sensor assembly, generally labeled 900. The assembly 900 includes a housing including a base 902 having a first surface 905 and an opposing second surface 907. The housing further includes a cover 904 (e.g., a housing lid), and an acoustic port 906. In an embodiment the port 906 extends between the first surface 905 and the second surface 907. In one implementation, the base 902 is a printed circuit board. The cover 904 is coupled to the base 902 (e.g., the cover 904 may be mounted onto a peripheral edge of the base 902). Together, the cover 904 and the base 902 form an enclosed volume 908 for the assembly 900.

As shown in FIG. 9, the acoustic port 906 is disposed on the base 902 and is structured to convey sound waves to the MEMS die 100 utilized as an acoustic transducer 1000 located within the enclosed volume 908. In other implementations, the acoustic port 906 is disposed on the cover 904 and/or a side wall of the cover 904. In some embodiments, the assembly 900 forms part of a compact computing device (e.g., a portable communication device, a smartphone, a smart speaker, an internet of things (IoT) device, etc.), where one, two, three or more assemblies may be integrated for picking-up and processing various types of acoustic signals such as speech and music.

The assembly 900 includes an electrical circuit disposed within the enclosed volume 908. In an embodiment, the electrical circuit includes an integrated circuit (IC) 910. In an embodiment the IC 910 is disposed on the first surface 905 of the base 902 and is electrically connected to the MEMS die 100 (as the acoustic transducer 1000). The IC 910 may be an application specific integrated circuit (ASIC). Alternatively, the IC 910 may include a semiconductor die integrating various analog, analog-to-digital, and/or digital circuits. In an embodiment the cover 904 is disposed over the first surface 905 of the base 902 covering the MEMS acoustic transducer 1000 and the IC 910.

In the assembly 900 of FIG. 9, the MEMS acoustic transducer 1000 is illustrated as being disposed on the first surface 905 of the base 902. The MEMS acoustic transducer 1000 converts sound waves, received through acoustic port 906, and/or vibrations, and/or sensed accelerations into a corresponding electrical sensor signal, and generates an electrical signal (e.g., a voltage) at a transducer output in response to the acoustic activity incident on the port 906, the vibrations, and/or the sensed acceleration. As shown in FIG. 9, the transducer output includes a pad or terminal of the transducer 1000 that is electrically connected to the electrical circuit disposed within the enclosed volume 908 via one or more bonding wires 912. The assembly 900 of FIG. 9 further includes electrical contacts, shown schematically as contacts 914, typically disposed on a bottom surface of the base 902. The contacts 914 are electrically coupled to the electrical circuit disposed within the enclosed volume 908. The contacts 914 are configured to electrically connect the assembly 900 to one of a variety of host devices.

As noted hereinabove, a plurality of MEMS devices can be manufactured in a single batch process. Individual portions of the batch process representative of individual MEMS devices are known as dies. Accordingly, a number of MEMS dies can be manufactured in a single batch process and then cut apart or otherwise separated for further fabrication steps or for their ultimate use, which for example without limitation includes as an acoustic transducer or other portion of a microphone.

Steps in a production process utilized to produce the MEMS die 100 as described hereinabove include etching, masking, patterning, cutting, boring, and/or release steps executed on a workpiece. All of the steps are not described in detail herein. However, generally the portions of the workpiece that ultimately end up as the structure of the MEMS die 100 are layered onto the workpiece using sacrificial material, or otherwise bored or etched out of a solid block of material.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

Unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical systems (MEMS) die, comprising:
    a first diaphragm;
    a second diaphragm;
    a first plurality of electrodes, each of the first plurality disposed on the first diaphragm;
    a second plurality of electrodes, each of the second plurality disposed on the second diaphragm;
    a fixed dielectric element disposed between the first and second diaphragms and including a plurality of apertures; and
    a third plurality of electrodes, each of the third plurality comprising
        a first conductive layer disposed on the first diaphragm proximate to at least one of the first plurality and
        a second conductive layer disposed on the second diaphragm proximate to at least one of the second plurality, and a conductive pin that extends through an aperture of the plurality of apertures and electrically connects the first conductive layer to the second conductive layer,
wherein the MEMS die generates one or more signals based on a change in capacitance resulting from movement of the first and second diaphragms relative to the fixed dielectric element.

2. The MEMS die according to claim 1, wherein the fixed dielectric element is free of conductive layers.

3. The MEMS die according to claim 1, wherein
at least subsets of the first plurality of electrodes are electrically connected to each other,
at least subsets of the second plurality of electrodes are electrically connected to each other, and
at least subsets of the third plurality of electrodes are electrically connected to each other.

4. The MEMS die according to claim 3, wherein:
the first diaphragm has a first side and a second side opposite the first side;
the second diaphragm has a first side and a second side opposite the first side;
the first side of the first diaphragm faces the first side of the second diaphragm; and further comprising
a first connector pad disposed on the second side of the first diaphragm in electrical connection with at least a first subset of the first plurality of electrodes;
a second connector pad disposed on the second side of the first diaphragm in electrical connection with at least a first subset of the second plurality of electrodes; and
a third connector pad disposed on the second side of the first diaphragm in electrical connection with at least a first subset of the third plurality of electrodes.

5. A MEMS device, comprising:
the MEMS die of claim 3;
further comprising a voltage source electrically connected to at least a first subset of the third plurality of electrodes to provide a voltage bias to at least the first subset of the third plurality of electrodes relative to ground;
a differential amplifier;
a first electrical connection between at least a first subset of the first plurality of electrodes and a first input to the differential amplifier; and
a second electrical connection between at least a first subset of the second plurality of electrodes and a second input to the differential amplifier.

6. The MEMS die according to claim 1, wherein a low pressure region relative to atmospheric pressure is defined between the first diaphragm and the second diaphragm.

7. The MEMS die according to claim 6, wherein
the first diaphragm has a first side and a second side opposite the first side;
the second diaphragm has a first side and a second side opposite the first side;
the first side of the first diaphragm faces the first side of the second diaphragm;
the low pressure region is bounded by the first sides of the first and second diaphragms;
the MEMS device further comprising:
a sealed tunnel that extends through the first and second diaphragms;
wherein the tunnel provides fluid communication between the second sides of the first and second diaphragms; and
wherein the tunnel is configured to maintain the low pressure region.

8. A MEMS device, comprising:
the MEMS die of claim 1;
an integrated circuit (IC); and
a housing comprising:
a base having a first surface and an opposing second surface;
a cover attached to the first surface of the base, wherein the cover and the base define an interior of the housing; and
a port that permits pressure waves to enter the interior, wherein the MEMS die is disposed within the interior of the housing; and
wherein the IC is disposed within the interior of the housing and electrically connected to the MEMS die.

9. The MEMS device of claim 8, wherein the port extends through the base and the MEMS die is disposed over the port.

10. The MEMS die of claim 1, wherein each of the first and second pluralities of electrodes and each of the first and second conductive layers of the third plurality of electrodes comprises a strip having a length to width ratio of at least about 5 to 1.

11. The MEMS die of claim 10, wherein the strips are substantially parallel, and wherein the strips of the first and third plurality of electrodes are arranged alternately side by side on the first diaphragm and the strips of the second and third plurality of electrodes are arranged alternately side by side on the second diaphragm.

12. A microelectromechanical systems (MEMS) die, comprising:
a first diaphragm;
a second diaphragm, wherein a low pressure region is defined between the first diaphragm and the second diaphragm;
a first plurality of electrodes, each of the first plurality disposed on the first diaphragm;
a second plurality of electrodes, each of the second plurality disposed on the second diaphragm;
a fixed dielectric element free of conductive layers disposed between the first and second diaphragms and including a plurality of apertures; and
a third plurality of electrodes, each of the third plurality comprising:
a first conductive layer disposed on the first diaphragm proximate to at least one of the first plurality;
a second conductive layer disposed on the second diaphragm proximate to at least one of the second plurality; and
a conductive pin that extends through an aperture of the plurality of apertures and electrically connects the first conductive layer to the second conductive layer;
the conductive pin providing structural integrity to prevent the diaphragms from collapsing onto the fixed dielectric element;
the MEMS die further comprising:
a sealed tunnel that extends through the first and second diaphragms;
wherein the MEMS die generates one or more signals based on a change in capacitance resulting from movement of the first and second diaphragms relative to the fixed dielectric element.

13. The MEMS die according to claim 12, wherein:
the first diaphragm has a first side and a second side opposite the first side;
the second diaphragm has a first side and a second side opposite the first side;
the first side of the first diaphragm faces the first side of the second diaphragm; and further comprising:

a first connector pad disposed on the second side of the first diaphragm in electrical connection with at least a first subset of the first plurality of electrodes;

a second connector pad disposed on the second side of the first diaphragm in electrical connection with at least a first subset of the second plurality of electrodes; and a third connector pad disposed on the second side of the first diaphragm in electrical connection with at least a first subset of the third plurality of electrodes.

14. A MEMS device, comprising:

the MEMS die of claim 13;

a voltage source electrically connected to at least a first subset of the third plurality of electrodes to provide a voltage bias to the first subset of the third plurality of electrodes relative to ground;

a differential amplifier;

a first electrical connection between at least a first subset of the first plurality of electrodes and a first input to the differential amplifier; and a second electrical connection between at least a first subset of the second plurality of electrodes and a second input to the differential amplifier.

15. The MEMS die according to claim 12, wherein the first diaphragm has a first side and a second side opposite the first side;

the second diaphragm has a first side and a second side opposite the first side; and the first side of the first diaphragm faces the first side of the second diaphragm;

wherein the tunnel provides fluid communication between the second sides of the first and second diaphragms; and wherein the tunnel is configured to maintain the low pressure region.

16. A MEMS device, comprising:

the MEMS die of claim 12;

an integrated circuit (IC); and a housing, the housing comprising:

a base having a first surface, an opposing second surface;

a cover attached to the first surface of the base, wherein the cover and the base define an interior of the housing; and a port that permits pressure waves to enter the interior, wherein the MEMS die is disposed within the interior of the housing;

wherein the IC is disposed within the interior of the housing and electrically connected to the MEMS die; and wherein the port extends through the base and the MEMS die is disposed over the port.

17. The MEMS die of claim 12, wherein each of the first and second pluralities of electrodes and each of the first and second conductive layers of the third plurality of electrodes comprises strips having a length to width ratio of at least about 5 to 1, wherein the strips are substantially parallel, and wherein the strips of the first and third plurality of electrodes are arranged alternately side by side on the first diaphragm and the strips of the second and third plurality of electrodes are arranged alternately side by side on the second diaphragm.

18. A microelectromechanical systems (MEMS) die, comprising:

a first diaphragm;

a second diaphragm;

a first electrode disposed on the first diaphragm;

a second electrode disposed on the second diaphragm;

a fixed dielectric element disposed between the first and second diaphragms and including an aperture, wherein the fixed dielectric element is isolated from any electrodes; and a third electrode, comprising:

a first conductive layer disposed on the first diaphragm;

a second conductive layer disposed on the second diaphragm; and a conductive pin that extends through the aperture and electrically connects the first conductive layer to the second conductive layer;

the conductive pin providing structural integrity to prevent the diaphragms from collapsing onto the fixed dielectric element;

wherein the MEMS die generates one or more signals based on a change in capacitance resulting from movement of the first and second diaphragms relative to the fixed dielectric element.

19. A MEMS device, comprising:

the MEMS die of claim 18;

a voltage source electrically connected to the third electrode, the voltage source providing a voltage bias relative to ground to the third electrode; and a differential amplifier comprising a first input electrically connected to the first electrode and a second input electrically connected to the second electrode;

the inputs of the differential amplifier each having an input impedance greater than about 1 giga-ohm and establishing a DC bias level at each input of less than the power supply level relative to ground potential and preferably less than half of the power supply level relative to ground.

20. The MEMS die according to claim 18, wherein a low pressure region relative to atmospheric pressure is defined between the first diaphragm and the second diaphragm.

* * * * *